United States Patent
Debono et al.

(10) Patent No.: US 10,870,207 B2
(45) Date of Patent: Dec. 22, 2020

(54) BARREL CAP ATTACH TRAYS

(71) Applicant: STMicroelectronics (Malta) LTD, Kirkop (MT)

(72) Inventors: Ryan Debono, Marsaxlokk (MT);
Stanley Martin Parnis, Naxxar (MT);
Nathan John Zammit, Bugibba (MT)

(73) Assignee: STMICROELECTRONICS (MALTA) LTD, Kirkop (MT)

( * ) Notice: Subject to any disclaimer, the term of this patent is extended or adjusted under 35 U.S.C. 154(b) by 212 days.

(21) Appl. No.: 15/842,511

(22) Filed: Dec. 14, 2017

(65) Prior Publication Data
US 2019/0184579 A1    Jun. 20, 2019

(51) Int. Cl.
| | | |
|---|---|---|
| *B25J 15/06* | (2006.01) | |
| *H05K 13/08* | (2006.01) | |
| *F15B 15/28* | (2006.01) | |
| *H05K 13/04* | (2006.01) | |

(52) U.S. Cl.
CPC ....... *B25J 15/0608* (2013.01); *F15B 15/2815* (2013.01); *H05K 13/0404* (2013.01); *H05K 13/08* (2013.01)

(58) Field of Classification Search
CPC ..... B25B 11/00; B25B 11/002; B25B 11/005; B25B 11/02; B25J 15/0608; B25J 15/06; B25J 15/0047; B25J 15/00; F15B 15/2815; H05K 13/0404; H05K 13/0406; H05K 13/0408; H05K 13/041; H05K 13/0411; H05K 13/0413; H05K 13/081; H05K 13/0812; H05K 13/0813; H05K 13/0815; H05K 13/0817; H05K 13/0818; H05K 13/082; H05K 13/083; H05K 13/084; H05K 13/085; H05K 13/0853; H05K 13/0857; H05K 13/086; H05K 13/087; H05K 13/0882; H05K 13/0885; H05K 13/0888; H05K 13/089; H05K 13/0895; H01L 21/677; H01L 21/67709; H01L 21/67754; H01L 21/67757
USPC ........ 29/559, 592; 269/8, 216, 165–215, 21, 269/900, 901, 903, 289 R; 362/33, 84, 362/209
See application file for complete search history.

(56) References Cited

U.S. PATENT DOCUMENTS

| | | | | |
|---|---|---|---|---|
| 4,213,698 A | * | 7/1980 | Firtion | B28D 5/00 355/77 |
| 4,846,483 A | * | 7/1989 | Sorensen | B41F 17/28 279/3 |
| 5,303,466 A | * | 4/1994 | Ozai | H01R 43/205 269/903 |
| 5,984,293 A | * | 11/1999 | Abrahamson | B23Q 1/035 269/236 |

(Continued)

FOREIGN PATENT DOCUMENTS

EP    0789393 A1  *  8/1997  ....... H01L 21/67369

*Primary Examiner* — Orlando E Aviles
*Assistant Examiner* — Robert F Neibaur
(74) *Attorney, Agent, or Firm* — Seed Intellectual Property Law Group LLP (57) ABSTRACT

One or more embodiments are directed to cap attach trays for holding barrel caps such that a pick-and-place tool can readily identify the cap and pick the barrel cap from the cap attach tray during the manufacturing process. The cap attach trays include a receiving layer having a plurality of protrusions each of which secures a barrel cap by mating to a through-hole in the barrel cap.

15 Claims, 6 Drawing Sheets

(56) References Cited

U.S. PATENT DOCUMENTS

| | | | |
|---|---|---|---|
| 6,688,300 B2 * | 2/2004 | Tieber | B28D 5/0094 |
| | | | 125/35 |
| 10,189,654 B2 * | 1/2019 | Herman | B65G 49/064 |
| 2018/0376631 A1 * | 12/2018 | Ziadeh | B41F 17/28 |
| | | | 279/3 |

* cited by examiner

BARREL CAP ATTACH TRAYS

BACKGROUND

Technical Field

Embodiments of the present disclosure are related to cap attach trays for holding barrel caps for use with semiconductor die based sensors.

Description of the Related Art

The introduction of a new generation of sensors has resulted in new, and sometimes unconventional, package designs. Among these designs are ones that include barrel caps. For instance, some semiconductor based sensor packages, such as temperature and humidity sensors, use a barrel cap to house the sensor and to create an environmental seal between a cavity around the sensor and the rest of the sensor's supporting substrate. During manufacturing of the sensor, the barrel caps are fed into a manufacturing machine and positioned over the sensor on the supporting substrate. These barrel caps are provided to the manufacturing machine on a reel of tape for use in surface mount technology. For example, a line of barrel caps are positioned with a base or a top of the barrel cap on the reel of tape using a mild adhesive. The reel of tape is then fed into the manufacturing machine and the machine transfers the barrel caps from the reel of tape to the sensor supporting substrates. The tape can be pressed onto the supporting substrates, with an adhesive on the supporting substrates having a greater adhesive strength than the adhesive on the reel and tape, or the machine can remove the barrel caps from the reel of tape and then position them on the supporting substrates. These tape reels with barrel caps are expensive, bulky, and inefficient.

Barrel caps were previously received on tape and reel, and then underwent a cap attach process on a chip shooter platform. To reduce production inefficiencies and cost, what is needed is a new device and method to receive the barrel caps in bulk and secure the barrel caps in position for use by a manufacturing machine.

BRIEF SUMMARY

One or more embodiments are directed to cap attach trays for holding barrel caps such that a pick-and-place tool may readily identify the cap and pick the cap from the cap attach tray during manufacturing of sensor packages. The cap attach trays include a receiving layer having a plurality of protrusions, each of which holds a barrel cap by mating to a through-hole in the barrel cap.

In one embodiment, each protrusion includes a pin that is the same shape and slightly smaller than a through-hole in the barrel cap. The barrel cap mates to the cap attach tray by sliding over the pin of the protrusion. In some embodiments, the protrusion includes a base that is stepped out from the pin. The base is slightly smaller than an opening at the base of the barrel cap and mates with the base of the barrel cap to provide additional stability.

The pin may be an opaque material such as an acrylic or a plastic, with the underlying portions of the cap attach tray having a portion with a contrasting coloration from the barrel caps to aid an optical alignment component in distinguishing the barrel caps from the cap attach tray. Additionally, the cap attach tray may include a magnetic layer that is formed below the protrusions to provide a magnetic holding force to hold the barrel caps once barrel caps are positioned on the protrusions on the cap attach tray.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Throughout the specification, the term "layer" is used in its broadest sense to include a thin film, a cap, or the like, and one layer may be composed of multiple sub-layers.

Specific embodiments of cap attach trays are described herein; however, the present disclosure and the reference to certain materials, dimensions, and the details and ordering of processing steps are exemplary and should not be limited to those shown.

Although there are many benefits with using pick-and-place machines, the Applicant has discovered some problems associated with using pick-and-place machines for transporting barrel caps when mounting barrel caps on sensor packages. In particular, the Applicant has discovered that a pick-and-place machine may not be able to grab barrel caps if the barrel caps are not precisely positioned on a cap attach tray. Additionally, the pick-and-place machine may position the cap attach tray at angles other than in a horizontal plane, such as 30 degrees, during the cap attach process and, thus, the barrel caps may fall out of place on the cap attach tray after an initial positioning.

One or more embodiments are directed to cap attach trays for holding barrel caps such that a pick-and-place machine may readily identify and select the barrel cap from the cap attach trays for transporting during the manufacturing process. The cap attach trays include a receiving layer having a plurality of protrusions, each of which holds a respective barrel cap. In particular, the protrusions extend into through openings of the barrel caps to hold the barrel caps.

In some embodiments, a magnetic strip is provided in the cap attach tray to give additional holding force to the barrel caps on the cap attach tray. A coloration layer below transparent protrusions may provide optical contrast to improve optical recognition by the pick-and-place machine of the barrel caps on the cap attach tray, in some embodiments. In one embodiment the protrusion is cylindrical.

In another embodiment, the protrusions hold the barrel caps using a two stage pin and base, with the pin providing lateral stability, and the base providing rotational stability around the pin. Thus, a combined structure having a square base design, or any other non-cylindrical shape, at the base and a cylindrical pin on the base can be implemented. The non-cylindrical shape of the base prevents the barrel cap from rotating about the protrusion when the barrel cap is placed onto the tray and on the protrusion. The cylindrical pin design offers stability in X and Y directions of the cap attach tray, even when the cap attach tray is tilted more than 30 degrees with respect to a horizontal plane. The combination of the pin and base, thus, may offer both lateral stability and rotational stability of the barrel cap without the use of a pocket, improving machine optical alignment. For added stability, the barrel cap may be securely fixed in position with an embedded magnetic layer. The magnetic layer can be embedded into the cap attach tray directly under the barrel caps to further improve barrel cap stability via a magnetic force. This force can be strong enough to improve stability, however still feeble enough so that the barrel cap can be picked by the machine during the cap attach process. These and other features are discussed in greater detail below.

Figure 1:
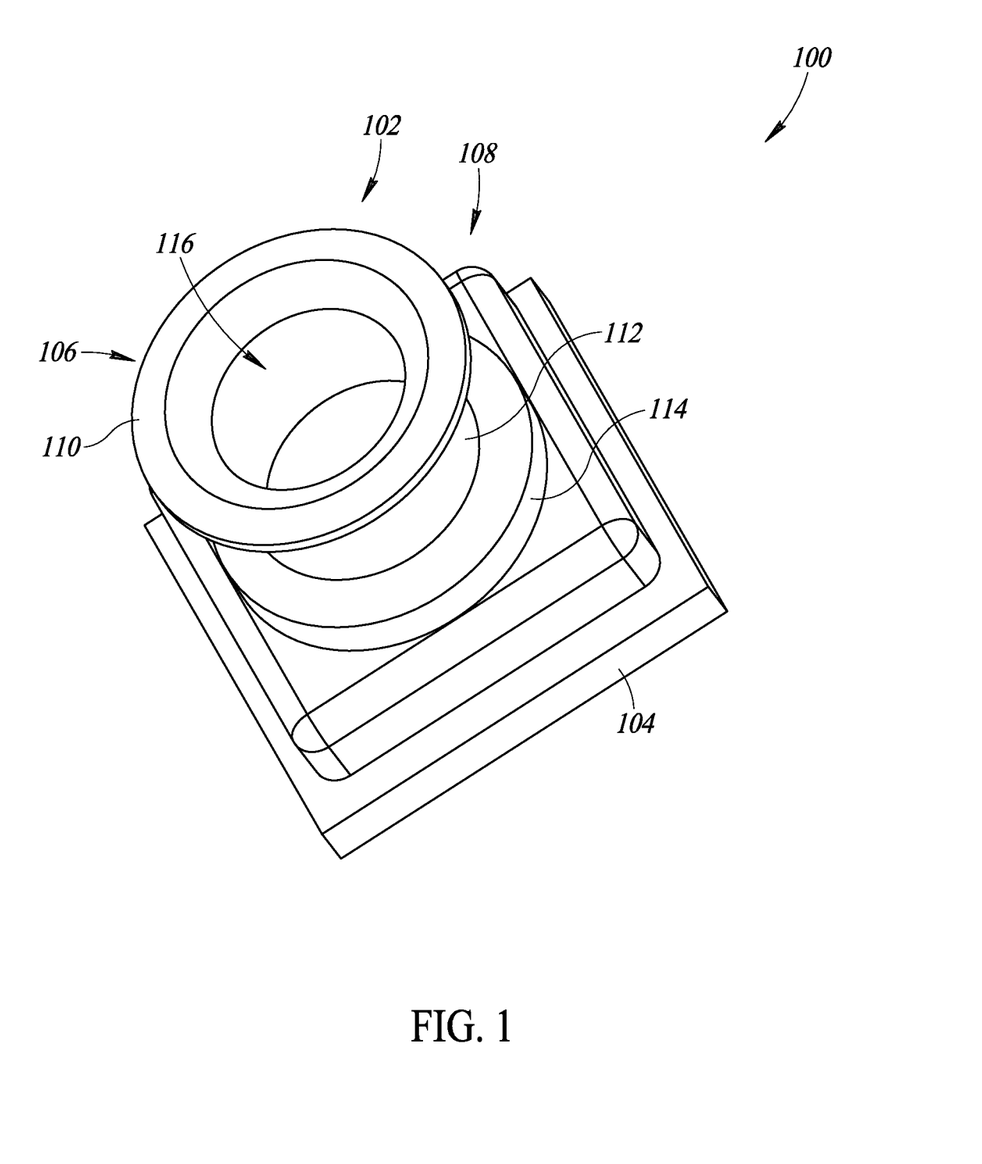
FIG. 1 is an isometric view of a sensor package including a barrel cap according to one embodiment.

FIG. 1 is an isometric view of a sensor package 100 including a barrel cap 102 according to one embodiment. The barrel cap 102 of the sensor package 100 is coupled over a sensor of a sensor die on a carrier chip 104. The sensor die may be made of semiconductor material, such as silicon. The sensor die may include a sensor of a variety of types. Exemplary types of sensors include temperature sensors, pressure sensors, microphones, proximity sensors, light sensors, smell sensors, moisture sensors, ultraviolet sensors, and electromagnetic wave sensors. In one embodiment, the sensor package 100 includes a pressure sensor. The sensor may be a MEMS sensor, a purely electrical sensor, or any other sensor type.

Generally described, the barrel cap 102 is a housing with a through-hole 116 that provides a solid structure around the sensor on the carrier chip 104. The housing of the barrel cap 102 is positioned on the carrier chip 104 so that the sensor is covered by the through-hole 116. The barrel cap 102 physically protects the sensor and controls the environment around the sensor. The barrel cap 102 can be formed from any number of materials, including various metals and metal alloys, such as stainless steel.

The barrel cap 102 environmentally isolates a surface of the carrier chip 104 from the remaining surfaces of the carrier chip 104. The barrel cap 102 is adhered to the carrier chip 104 using an adhesive on a bottom side of the barrel cap 102. The barrel cap 102 and the adhesive are impermeable to fluids such that a fluid through-hole 116 in the barrel cap 102 will not reach the remaining surfaces of the carrier chip 104 without first exiting the top of the barrel cap 102. For example, water in the barrel cap would be in fluid communication with the sensor, but would be prevented from contacting the surfaces of the carrier chip 104 outside the barrel cap 102 unless it passes through the top of the barrel cap. In some embodiments, the sensor package will be installed internally in a system such as a mobile device. In these embodiments, the top of the barrel cap 102 will be put in fluid communication with the environment external to the system, with a seal between a surface of the system and the top of the barrel cap 102 to prevent the internals circuitry of the system from being exposed to the external environment. The adhesive applied to the bottom of the barrel cap 102 can be an epoxy, in some embodiments.

The barrel cap 102 of FIG. 1 has a barrel 106 and a base 108. The barrel 106 is generally in the shape of a hollow cylinder and the base 108 is generally in the shape of a hollow rectangular cuboid. The through-hole 116 extends through the barrel 106 and the base 108. The through-hole 116, however, may have a different shape in the barrel 106 than in the base 108 as will be described in more detail below. In other embodiments, the barrel cap may be a single section that is generally shaped as the barrel 106, the base 108, or in some other general shape, such as a hollow octagonal prism, a hollow frustum, or any other solid figure with a through-hole.

The barrel 106 of the barrel cap 102 has a body 112, an outer flange 110 on a first side of the body 112, and an inner flange 114 on a second side of the body 112. The inner flange 114 is between the main body 112 of the barrel 106 and the base 108. The outer flange 110 and inner flange 114 bound the ends of the barrel 106 with circular lips that have a greater diameter than a diameter of the main body 112. In some embodiments, a diameter of the lip of the outer flange 110 is equal to a diameter of the lip of the inner flange 114. In other embodiments, the diameter of the lip of the outer flange 110 is different than the diameter of the lip of the inner flange 114, being either smaller or larger. Additionally, the outer and inner flanges 110, 114 may be different or equal thicknesses measured in a direction orthogonal to the surface of the sensor die or carrier chip 104 covered by the barrel cap 102. In one embodiment, the thickness of the outer flange 110 is less than a thickness of the inner flange 114, which is less than a thickness of the main body 112. In some embodiments, there is no inner flange 114.

The through-hole 116 provides a passage way for an environment external to the sensor package 100 to be in fluid communication with a sensor on the carrier chip 104. The internal shape of the through-hole 116 in the barrel 106 is different from the internal shape of the through-hole 116 in the base 108. In particular, the through-hole 116 in the barrel 106 of the barrel cap is cylindrical shaped, while the through-hole 116 in the base 108 is non-circular, such as rectangular or square. In some embodiments, the ends of the through-hole may be curved or slanted away from or towards a centerline of the through-hole 116, or the through-hole may be in any shape, such as an octagonal prism or hyperboloid of one sheet. Additionally, with the through-hole 116 through the outer and inner flanges 110, 114, the outer and inner flanges 110, 114 may be any number of shapes, including torus, rectangular toroids, irregular toroids, or any shape that is generally annular from at least one viewing angle.

The through-hole 116 is in direct or indirect fluid communication with the sensor attached to the carrier chip 104. For example, the sensor can extend from the carrier chip 104 into the through-hole 116 to be directly in fluid communication. Alternatively, the sensor may reside in a cavity in the base 108 and, thus, be in indirect fluid communication with the through-hole 116 through the cavity in the base 108.

Figure 2A:
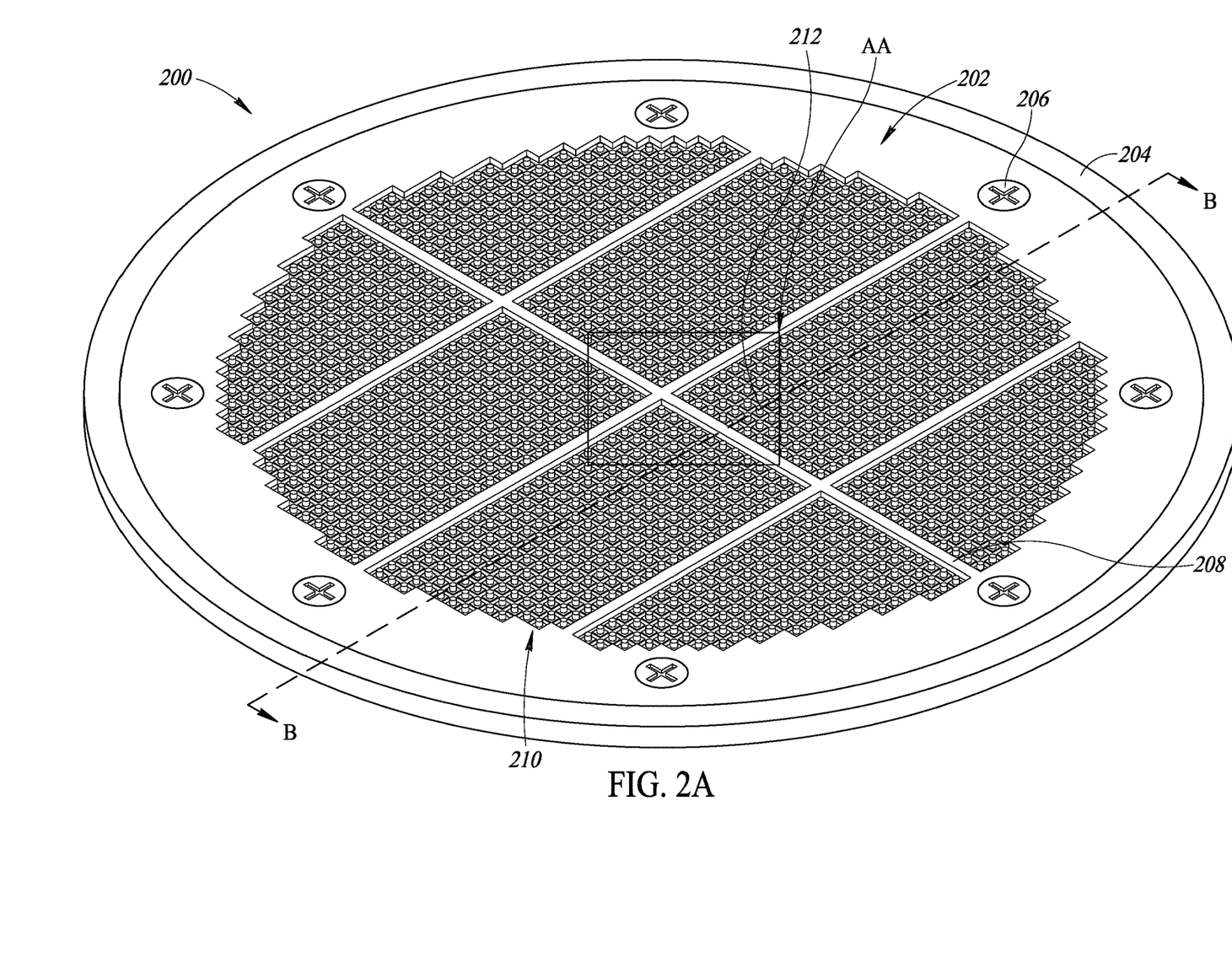
FIG. 2A is a top isometric view of a cap attach tray according to one embodiment.
Figure 2B:
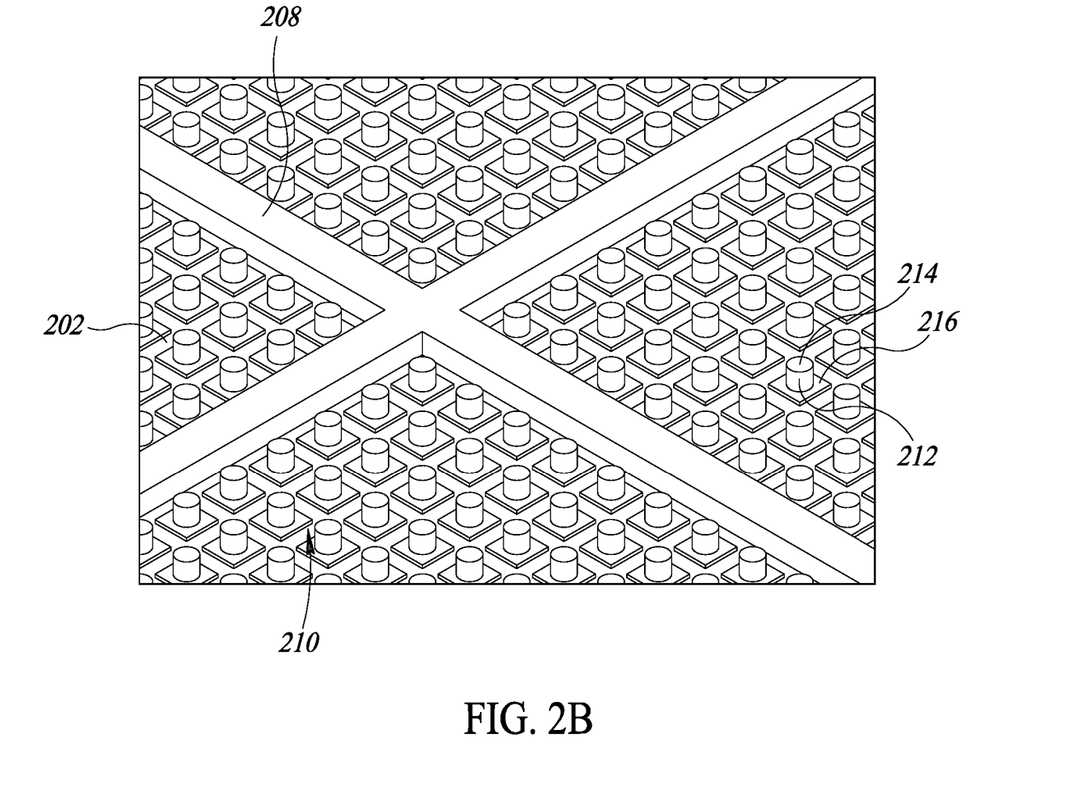
FIG. 2B is an isometric view of the cap attach tray taken at a magnified area AA of FIG. 2A.
Figure 2C:
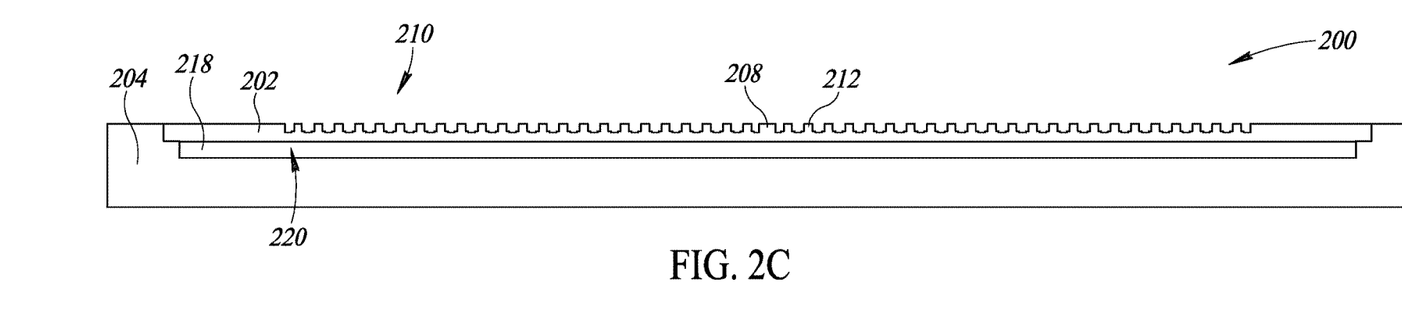
FIG. 2C is a cross-sectional view of the cap attach tray taken at a cross-sectional line BB of FIG. 2A.

FIGS. 2A-2C are various views of a cap attach tray 200 according to one embodiment. Specifically, FIG. 2A is a top isometric view of the cap attach tray 200. FIG. 2B is an isometric view of the cap attach tray 200 taken at a magnified area AA of FIG. 2A and illustrates a number of features of one embodiment of the receiving layer 202. FIG. 2C is a cross-sectional view of the cap attach tray 200 taken at a cross-sectional line BB of FIG. 2A. 2 3The cap attach tray provides a tray for holding barrel caps, such as the barrel cap 102 of FIG. 1, during manufacturing of a sensor package, such as the sensor package 100 of FIG. 1.

The cap attach tray 200 includes a receiving layer 202 that interfaces with the barrel caps to hold the barrel caps in position. In particular, the cap attach tray 200 holds the barrel caps such that an automated tool, such as a pick-and-place tool, can identify and grab the barrel cap using an automated visual system.

To hold the barrel caps, the receiving layer 202 includes a plurality of protrusions 210, including protrusion 212. The plurality of protrusions 212 holds the barrel caps into a position and in some embodiments hold the barrel caps in a particular orientation. Generally described, the protrusions 212 are shaped to correspond to at least a portion of a through-hole 116 of a barrel cap to be assembled on a sensor package. That is, the plurality of protrusions 210 is any shape or size that holds the barrel caps on the cap attach tray 200.

The plurality of protrusions 210 hold the barrel caps in a position and in some embodiments hold the barrel caps in a particular orientation. The height of the protrusion 212 is such that an upper surface of the protrusion 210 is below a height of the barrel cap so that the pick-and-place machine has adequate spacing to grab the barrel cap from the cap attach tray 200.

The plurality of protrusions 212 can be a simple pin, such as a cylindrical column, or more may also include a feature that prevents rotation of the barrel caps, such as the protrusions 212 depicted in FIG. 2B. Each protrusion 212 of the plurality of protrusions 210 includes a pin 214 and a base 216. The pin 214 is a cylindrical column and the base 216 is a rectangular cuboid, with the pin 214 being centered on a top surface of the base 216. The pin 214 has a height greater than a height of the base 216, and the base 216 has a width greater than a diameter of the pin 214. In other embodiments, other combinations of solid shapes and other combinations of sizes are possible. The pin 214 and the base 216 may be strictly conforming shapes with very precise corners and edges or, in some embodiments, the corners and edges may include slopes (e.g., chamfer, bevel), tapering, or curvature (e.g., rounding, fillet). These alternate embodiments may be implemented for a variety of reasons, including providing an easier mating between the plurality of protrusions 210 and the barrel caps.

The pin 214 provides lateral stability to hold a barrel cap positioned over the pin 214, even when the cap attach tray 200 is positioned at angles off of the horizontal plane, such as a 30 degree angle for the pick-and-place machine to pick the barrel caps. Because it is a cylindrical column, the pin 214 may not control rotation of the barrel cap around a center axis of the pin 214. The base 216 provides rotational stability to the barrel cap positioned over the base 216, as the rectangular cuboid shape prevents rotation of the base of the barrel cap positioned over it similar to a Robertson screw drive system, with the base as the driver.

In the embodiment depicted in FIG. 2A, the plurality of protrusions 210 are inset in a recess on the top surface of the receiving layer 202 and the plurality of protrusions 210 project out from the recess. In some embodiments, the protrusions 210 have top surfaces that are coplanar with the top surface of the receiving layer 202. In other embodiments, the top surface of the protrusions 210 may be at different heights above or below the top surface of the receiving layer 202. For instance, the receiving layer 202 of the illustrated embodiment includes a plurality of support walls 208. In particular, the receiving layer 202 includes four support walls, a first wall in a first direction and second, third, and fourth walls perpendicular to and crossing the first wall. The top surfaces of the plurality of support walls 208 can be coplanar with the top surfaces of the plurality of protrusions 210. Furthermore, the plurality of support walls 208 may intersect in such a way as to segregate groups of barrel caps from each other on the cap attach tray 200. The plurality support walls 208 may be implemented purely for structural purposes, or may be implemented to account for a need to segregate groups of barrel caps, such as by creating space between parallel pick-and-place machine pickers. In some embodiments, the receiving layer 202 has no support walls.

As shown in FIG. 2C, the cap attach tray 200 may also include a magnetic layer 218 to aid in holding the barrel caps on the cap attach tray 200. In particular, the magnetic layer 218 creates a magnetic force between the magnetic layer 218 and the barrel caps when the barrel caps use a ferromagnetic material. The magnetic layer 218 is of suitable strength to secure the barrel caps in position when the cap attach tray is being moved and positioned in the pick-and-place machine and to allow the pick-and-place machine to remove the barrel cap from the cap attach tray 200 during manufacturing. In one embodiment, the magnetic layer 218 has a suitable magnetic strength to overcome the force of gravity on the barrel caps such that the magnetic layer 218 holds the barrel caps in position when the tray is inverted upside down and the barrel caps are not being supported by the plurality of protrusions 210.

The magnetic layer 218 may be between the receiving layer 202 and a supporting substrate 204 as shown in FIG. 2C. In particular, the receiving layer 202 is secured to the supporting substrate 204 with the magnetic layer 218 between. The magnetic layer 218 may be a single layer or strips of layers that are located below or proximate the protrusions 210. In at least one embodiment, the supporting substrate 204 may also be the magnetic layer 218.

The supporting substrate 204 may also be provided to provide structural support for the receiving layer 202, if needed. In at least one embodiment, the supporting substrate is Aluminum. The supporting substrate 204 may include a plurality of holes or other cutouts (not shown) to reduce the weight of the supporting substrate, for example holes may be formed in portions of the supporting substrate under the receiving layer. In some embodiments, the supporting substrate 204 is approximately the same shape as the receiving layer 202, but larger in size with a recess that the receiving layer is inserted into. In these embodiments, the receiving layer 202 is partially or completely recessed into a side of the receiving layer. In other embodiments, the receiving layer 202 sits on top of one side of the supporting substrate 204.

The cap attach tray 200 is shown with the receiving layer 202 coupled to the supporting substrate 204. The receiving layer 202 is inset and the top of the receiving layer 202 is coplanar with the top of the supporting substrate 204. The plurality of protrusions 210 project away from a recess in the receiving layer 202, with the top surface of the plurality of protrusions 210 being coplanar with both the top surface of the supporting substrate 204 and the top surface of the receiving layer 202. The plurality of supporting walls 208 show a first wall being intersected at a center of the receiving layer, the wall of the plurality of supporting walls 208 having larger dimensions in the cross-sectional view than the plurality of protrusions 210.

The receiving layer 202 is coupled to the supporting substrate 204 using mounting screws 206, in one embodiment. In other embodiments the receiving layer is securing to the supporting substrate using other methods, such as with an adhesive or a compressive force from pressing the receiving layer 202 into the supporting substrate 204.

The cap attach tray 200 may also include a coloration layer 220 that aids the optical alignment component of the pick-and-place machine by providing color contrast between the cap attach tray 200 and the barrel caps during automated optical inspection. The coloration layer 220 may be any one of a number of different types of layer. In one embodiment, the coloration layer 220 is a thin sheet of colored material, such as paper, that is provided on the top surface of the receiving layer 202. In another embodiment, the coloration layer 220 is a paint or ink applied to a surface of one of the layers of the cap attach tray 200.

The coloration layer provides a color that contrasts with the color of the barrel caps. For example, for a silver or black barrel cap the coloration layer can be white or some other light color, and for a white barrel cap the coloration can be black or some other dark layer. In some embodiments, the receiving layer 202 is transparent or semi-transparent. In these embodiments, the coloration layer can be a sheet of colored paper between the receiving layer 202 and the supporting substrate 204. The pick-and-place machine, thus, may be able to distinguish the barrel caps more easily from the contrasting coloration layer visible through the transparent or semi-transparent receiving layer 202.

Although the cap attach tray 200 is shown as being made from multiple layers, in some embodiments the cap attach tray 200 may be formed as a single piece. The cap attach tray 200 and its various layers may be fabricated with any fabrication method, such as with a CNC machine, molding, or 3D printing.

Embodiments of the receiving layer include any number of barrel cap positions, in any layout. For example, the cap attach tray is shown as a short and wide circular column. Other shapes are possible, including a rectangular cuboid. The receiving layer 202 can be any one of a number of materials, such as acrylic or plastic, such as Perspex, and in some embodiments it is a transparent material.

During manufacturing of sensor packages, the cap attach tray 200 is populated with barrel caps. In some embodiments, a jig automatically populates the tray with barrel caps. A negative copy of a surface of the cap attach tray 200 is fabricated in such a way that the barrel caps fall into place under the force of gravity, but can only fall into place in one specific orientation. A controlled vibration may be added to the negative copy to induce the barrel caps to more readily fall into place. The cap attach tray 200 is then aligned and locked onto the negative copy, and both are flipped together. The negative copy can then be removed leaving the cap attach tray 200 fully populated with the barrel caps. In other embodiments, the cap attach tray 200 is prepopulated prior to delivery to the manufacturing site with the pick-and-place machine.

The cap attach tray 200 populated with barrel caps is then transported to a pick-and-place machine for manufacturing sensor packages. The cap attach tray 200 holds the barrel caps in position during the movement to the pick-and-place machine, and also during the manufacturing process with the pick-and-place machine, in which the orientation of the cap attach tray may be angled off the horizontal plane, and the cap attach tray 200 may be moved in short sharp incremental steps to align the picker with a barrel cap.

Figure 3:
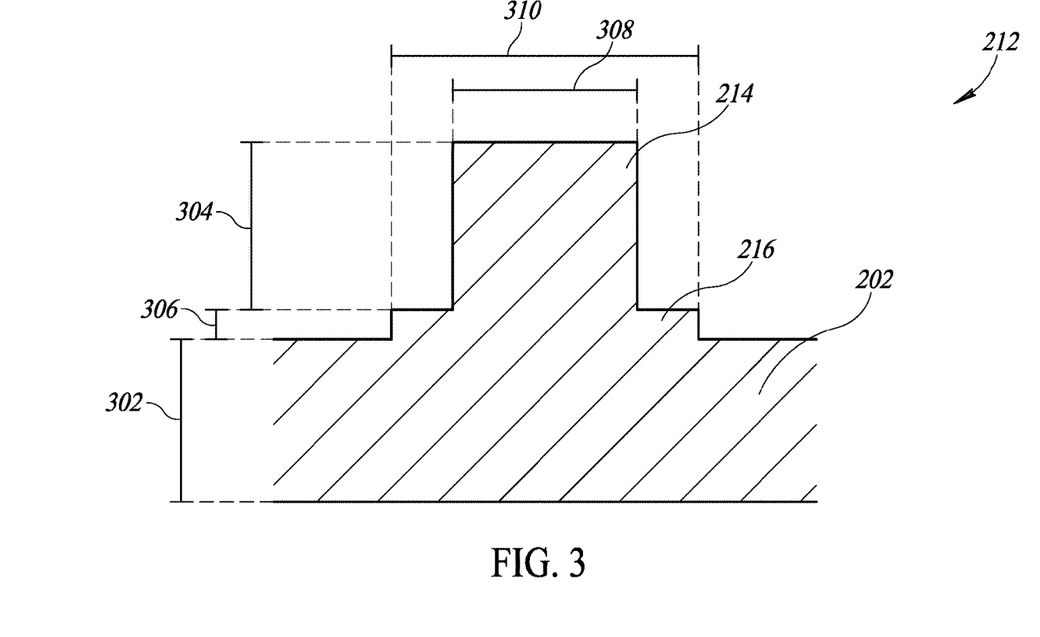
FIG. 3 is a magnified cross-sectional view of a protrusion of a cap attach tray according to one embodiment.

FIG. 3 is a cross-sectional view of the protrusion 212, according to one embodiment. The protrusion 212 is shown with the pin 214 on the base 216, which is on the receiving layer 202. The receiving layer 202 and the protrusion 212 may be integrally formed in some embodiments. In other embodiments, the receiving layer 202, the pin 214, or the base 216 may be different layers of material coupled together. The receiving layer 202 has a first height 302 measured from a back side to a front side of the receiving layer at the recess. The pin 214 has a second height and the base 216 has a third height 306. In some embodiments, the first height 302 is approximately equal to a second height 304 plus the third height 306. In other embodiments, the heights 302, 304, 306 are unrelated to one another. In some embodiments, the sum of first height 302, the second height 304, and the third height 306 is equal to an overall maximum height of the receiving layer, and in other embodiments is not. In some embodiments, the second height is 1.38 mm and the third height is 0.3 mm.

The pin 214 also has a first width 308 and the base 216 has a second width 310. In some embodiments, the first width 308 is less than the second width 310. In other embodiments, the first width 308 is approximately equal to the second width 310. In some embodiments, the first width is 1.54 mm and the second width is 2.58 mm.

Figure 4A:
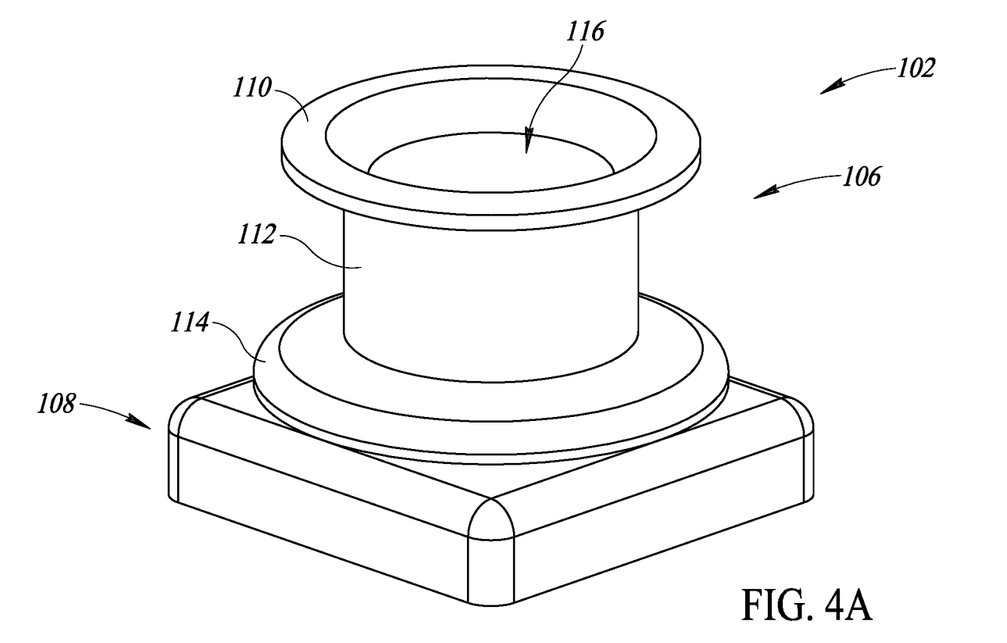
FIG. 4A is an isometric view of a barrel cap according to one embodiment.
Figure 4B:
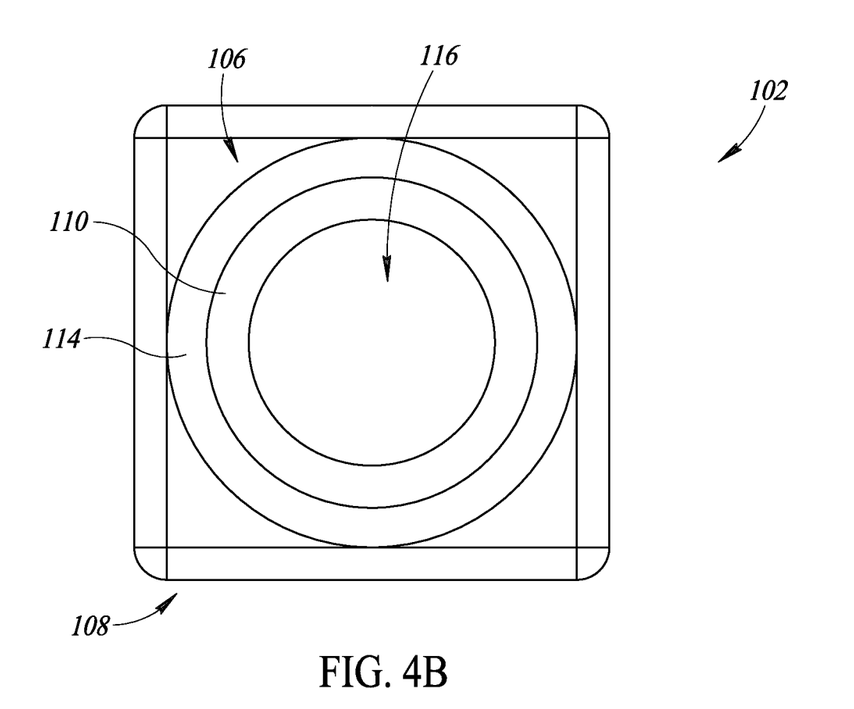
FIG. 4B is a top down view of the barrel cap of FIG. 4A.

FIGS. 4A and 4B are various views of the barrel cap 102. Specifically, FIG. 4A is an isometric view of the barrel cap in further detail. As depicted in FIG. 4A, the outer and inner flanges 110, 114 include curved portions on the inner or outer surfaces. For example, the outer flange 110 includes a rounded (fillet) interior surface such that the diameter of the through-hole 116 decreases as penetration into the barrel cap 102 increases, to a point where the diameter normalizes in the barrel 106. The inner flange 114 has a rounded exterior edge. Additionally, a top outer edged and corners of the base 108 are depicted having a rounded edge.

FIG. 4B is a top down view of the barrel cap 102. The outer flange 110 has an outer diameter that is less than an out diameter of the inner flange 114. The outer diameter of the inner flange 114 is less than an outer width of the base 108. The inner diameter of the barrel 106 is less than or equal to the inner diameter of the outer flange 110, the inner flange 116, and the inner width of the base 108. Although not shown, the through opening in the base 108 is rectangular shaped, while the through opening in the barrel 106 is cylindrically shaped.

Figure 5A:
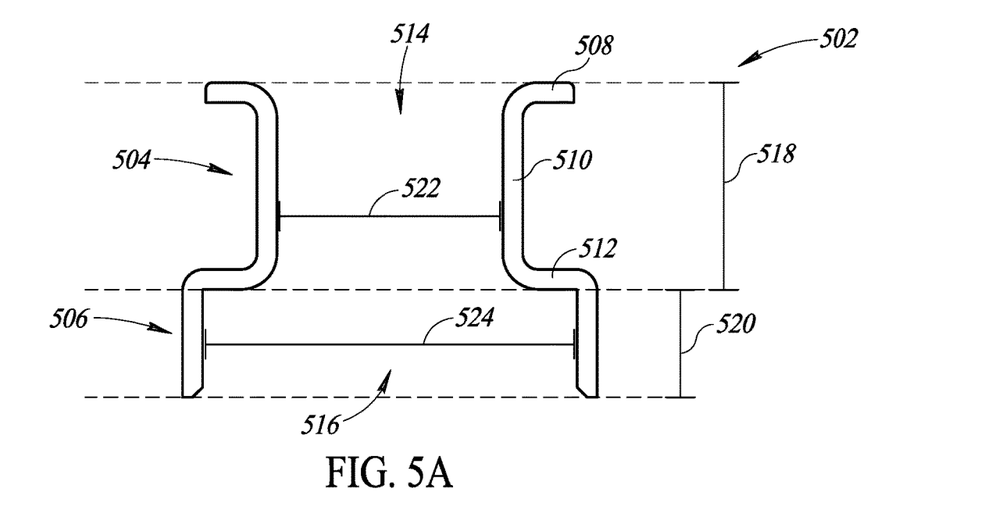
FIG. 5A is a cross-sectional view of a barrel cap according to another embodiment.
Figure 5B:
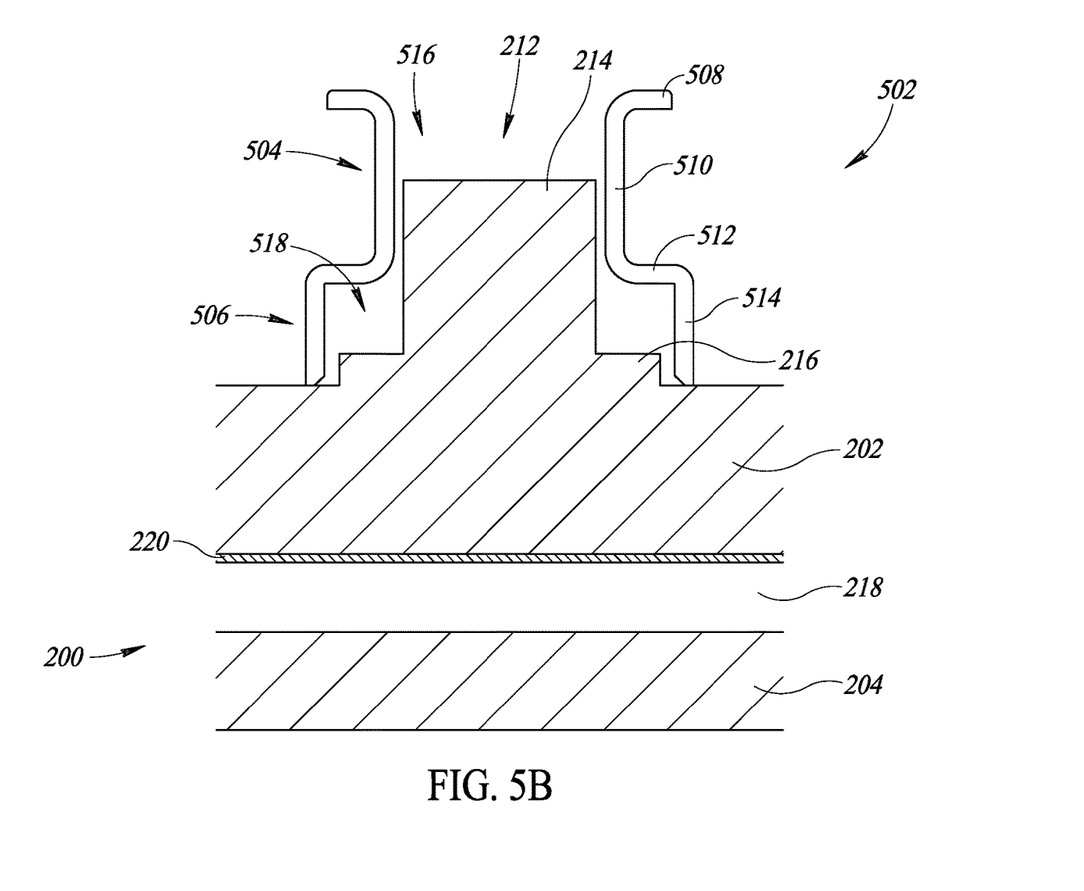
FIG. 5B is a cross-sectional view of the barrel cap of FIG. 5A being positioned on the cap attach tray of FIG. 2A.

FIGS. 5A and 5B are various views of a barrel cap 502 being positioned on the cap attach tray 200, according to one embodiment. Specifically, FIG. 5A is a cross-sectional view of the barrel cap 502.

The barrel cap 502 shares some similarities with the barrel cap 102. For example, the barrel cap 502 includes a barrel 504 on a base 506, with the barrel 504 having an outer flange 508 coupled to a main body 510, the main body 510 coupled to an inner flange 512. The inner flange 512 is coupled between the main body 510 and the base 506. The barrel cap 502 includes a though-hole 514 through the barrel 504 that extends to a through-hole 516 in the base 506. The variations discussed above with respect to barrel cap 102 similarly apply to some embodiments of the barrel cap 502.

The barrel cap 502 differs from the barrel cap 102 in that the inner flange 512 is a flat rectangular sheet with a circular hole in it. The body 510 covers the hole in the inner flange 512, and the inner flange 512 extends to the corners of the base 506. Additionally, the edges of the inner flange 512 where it meets the body 510 and the base 506 are rounded. Additionally, a bottom edge of the base 506 includes chamfering around an interior edge.

The barrel 504 has a first height 518 measured from a top of the outer flange 508 to a bottom of the inner flange 512. The base 506 has a second height measured from the bottom of the inner flange 512 to a bottom of the base 506. The first height 518 may be equal to or different from (such as greater or smaller than) a second height 520. In some embodiments, the second height 304 is smaller than the first height 518. In other embodiments, the second height 304 is greater than or equal to the first height 518. In some embodiments, the third height 306 is greater than the second height 520. In other embodiments, the third height 306 is less than or equal to the second height 520.

The barrel 504 has a first width 522 measured between inner walls of the body 510. The base 506 has a second width measured between inner walls. The first width 522 may be equal to or different from (such as greater or smaller than) a second width 524. In some embodiments, the first width 308 is less than or equal to the first width 522. Additionally, in some embodiments, the second width 310 is less than or equal to the second height 520. In other embodiments, the protrusion 212 is oversized, being bigger than the openings in the barrel cap in at least one dimension, but the protrusion 212 is constructed of a compressible material that can be compressed to receive the barrel cap 502.

FIG. 5B is a cross-sectional view of the barrel cap 502 of FIG. 5A being positioned on the cap attach tray 200 of FIG. 2A. The protrusion 212 is shown with the pin 214 on the base 216, which is on the receiving layer 202. The base 506 is passed over a top of the pin 214 and roughly aligned until the barrel 504 engages the pin 214 by sliding over the pin 214. The tolerance between the interior walls of the barrel 504 and the pin 214 is 0.1 mm, in some embodiments. The barrel cap 502 is moved farther down the pin 214 so that the base 506 engages the base 216. The chamfered interior edge of the base 506 allows for some rotational misalignment to be corrected by the movement of bringing the barrel cap 502 down on the protrusion 212. The tolerance between the interior walls of the base 506 and the base 216 is 0.1 mm, in some embodiments.

Because the pin 214 is cylindrical, the barrel cap 502 is free to rotate around the center axis of the pin 214 until the base 506 engages with the base 216. In particular, the shape of the base 506 and the base 216 is a non-cylindrical shape and prevents rotation of the barrel cap 502 around the protrusion 212. More particularly, rotation is greatly restricted by the corners of the base 216 mating to the corners of the through-hole 516. The barrel cap 502 may rest on the top surface of the recess in the receiving layer 202, or in other embodiments, the barrel cap may be suspended above the top surface of the recess in the receiving layer, such as from the inner flange 512 contacting the base 216, or from the walls of the barrel 504 or base 506 being held by a compressive force from the protrusion 212, such as from one or both being tapered in shape.

The various embodiments described above can be combined to provide further embodiments. Aspects of the embodiments can be modified, if necessary to employ concepts of the various patents, applications and publications to provide yet further embodiments. Furthermore, these embodiments are not limited to the specific barrel caps discussed above. Any tape and reel systems for moving barrel caps can be substituted with the above described embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A pick-and-place accessory tray system, comprising:
a plurality of barrel caps; and
a cap attach tray that holds the plurality of barrel caps in position when assembled with sensor packages, wherein the cap attach tray comprises:
a receiving layer having a first surface; and
a plurality of protrusions extending from the first surface, the plurality of protrusions having outer surfaces that extend into through-holes of the plurality of barrel caps, respectively, and hold the plurality of barrel caps in position on the cap attach tray.

2. The pick-and-place accessory of claim 1 wherein each protrusion of the plurality of protrusions includes a cylindrical pin, wherein each one of the cylindrical pins extend into a corresponding one of the through-holes of the plurality of barrel caps, respectively.

3. The pick-and-place accessory of claim 1 wherein each protrusion of the plurality of protrusions includes a non-cylindrical base that is coupled to a corresponding one of the cylindrical pins, wherein outer surfaces of the non-cylindrical bases are rectangular, and prevent rotation of the plurality of barrel caps when the plurality of barrel caps are held on the cap attach tray.

4. The pick-and-place accessory of claim 3, wherein the non-cylindrical bases are rectangular cuboid bases, the rectangular cuboid bases being on the first surface of the receiving layer, and each one of the cylindrical pins being on a respective one of said rectangular cuboid bases, respectively.

5. The pick-and-place accessory of claim 1, further comprising:
a support substrate coupled to the receiving layer, the receiving layer being inset into a recess in the supporting substrate.

6. The pick-and-place accessory of claim 1, further comprising: a magnetic layer coupled to the receiving layer, the magnetic layer being configured to hold the plurality of barrel caps in position by magnetic force.

7. The pick-and-place accessory of claim 1, further comprising:
a coloration layer, the coloration layer configured to be obscured by the plurality of barrel caps and visible through the respective through-holes of each one of the plurality of barrel caps.

8. The pick-and-place accessory of claim 7 wherein the receiving layer is semi-transparent and the coloration layer is positioned on a second surface of the receiving layer opposite the first surface.

9. A cap attach tray comprising:
a receiving layer having a first surface;
a plurality of protrusions extending from the first surface, the plurality of protrusions configured to extend into through-holes of a plurality of barrel caps, respectively and configured to hold the plurality of barrel caps in position on the cap attach tray; and
a coloration layer configured to be obscured by the plurality of barrel caps and visible through the respective through-holes of each one of the plurality of barrel caps, wherein the coloration layer is a sheet of colored paper.

10. A device, comprising:
a plurality of barrel caps; and
a cap attach tray that holds the plurality of barrel caps in position during assembly with sensor packages, wherein the cap attach tray comprises:
a supporting substrate; and
a barrel cap receiving layer on the supporting substrate, the receiving layer including a plurality of barrel cap protrusions, each of the barrel cap protrusions including a base on a surface of the receiving layer and a pin on the base, the pin having a column shape with a diameter equal to a first width, the base having a rectangular cuboid shape with a second width, the second width being greater than the first width.

11. The device of claim 10 wherein the receiving layer is inset in a recess in the supporting substrate.

12. The device of claim 11 wherein an upper surface of each of the pins is coplanar with an upper surface of the supporting substrate.

13. The device of claim 10, further comprising a magnetic layer coupled between the supporting substrate and the receiving layer, the magnetic layer inset in a recess in the supporting substrate.

14. The device of claim 10, further comprising a coloration layer coupled to the receiving layer.

15. The device of claim 14, wherein the coloration layer is positioned between the receiving layer and the supporting substrate.

* * * * *